(12) United States Patent
Cai

(10) Patent No.: US 12,219,803 B2
(45) Date of Patent: Feb. 4, 2025

(54) DISPLAY PANEL AND DISPLAY APPARATUS

(71) Applicant: WUHAN TIANMA MICROELECTRONICS CO., LTD., Wuhan (CN)

(72) Inventor: Yu Cai, Wuhan (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 541 days.

(21) Appl. No.: 17/507,421

(22) Filed: Oct. 21, 2021

(65) Prior Publication Data

US 2022/0045304 A1  Feb. 10, 2022

(30) Foreign Application Priority Data

Aug. 23, 2021  (CN) .......................... 202110966030.8

(51) Int. Cl.
*H10K 50/858* (2023.01)
*H10K 59/12* (2023.01)

(52) U.S. Cl.
CPC ........... *H10K 50/858* (2023.02); *H10K 59/12* (2023.02)

(58) Field of Classification Search
CPC .. H10K 50/858; H10K 59/878; H10K 59/879; H10K 59/12; H10K 59/353; H10K 59/90; H10K 59/95; H10K 59/35; H10K 59/352; H01L 27/156
See application file for complete search history.

(56) References Cited

U.S. PATENT DOCUMENTS

2022/0013607 A1 * 1/2022 Lee ...................... H10K 59/875

FOREIGN PATENT DOCUMENTS

| CN | 111446379 A | 7/2020 | |
|---|---|---|---|
| CN | 111834542 A | * 10/2020 | ......... H01L 27/3241 |

OTHER PUBLICATIONS

English Translation of the First Chinese Office Action mailed on Aug. 30, 2023, issued in the corresponding Chinese App. No. 202110966030.8, filed on Aug. 23, 2021, 10 pages.
Chinese Office Action mailed Aug. 30, 2023, issued in related Chinese Application No. 2021109660308, 10 pages.

* cited by examiner

*Primary Examiner* — Moazzam Hossain
(74) *Attorney, Agent, or Firm* — CHRISTENSEN O'CONNOR JOHNSON KINDNESS PLLC

(57) ABSTRACT

A display panel and a display apparatus are provided. The display panel includes a substrate, a light-emitting component layer and a light-extraction layer. An orthographic projection of a first-color light-emitting component of the light-emitting component layer overlaps with an orthographic projection of a first light-extraction structure of the light-extraction layer. An orthographic projection of the first light-extraction structure overlaps with an orthographic projection of the first-color light-emitting component. First light-extraction structures includes first sidewalls including first sub-sidewall and second sidewalls. A maximum angle α1 formed between a tangent plane of the first sidewall and the plane of the substrate is greater than a maximum angle α2 formed between a tangent plane of the second sub-sidewall and the plane of the substrate.

21 Claims, 10 Drawing Sheets

DISPLAY PANEL AND DISPLAY APPARATUS

CROSS-REFERENCE TO RELATED APPLICATIONS

The present application claims priority to Chinese Patent Application No. 202110966030.8, filed on Aug. 23, 2021, the content of which is incorporated herein by reference in its entirety.

TECHNICAL FIELD

The present disclosure relates to the field of display technologies, and, particularly, relates to a display panel and a display apparatus.

BACKGROUND

Organic Light Emitting Diode (OLED) display panels have been widely applied due to their excellent performance characteristics, such as high brightness, high efficiency, wide viewing angle, and autonomous luminescence.

The OLED display panels generally adopt a top-emission mode. In order to extract light emitted by the light-emitting element to a greater extent and improve light extraction efficiency of the panel, a light-extraction layer is usually provided in the panel. The light-extraction layer is provided with a simple lens structure as a light-extraction structure, and the light-extraction structure improves the light extraction efficiency through refraction of light. However, the refraction is likely to cause color cast of the OLED display panel.

SUMMARY

In a first aspect of the present disclosure, a display panel is provided. The organic light-emitting display panel includes a substrate, a light-emitting component layer, and a light-extraction layer. The light-emitting component layer is provided at a side of the substrate facing towards a light-emitting surface of the display panel and includes light-emitting components. The light-extraction layer is provided at a side of the light-emitting component layer facing towards the light-emitting surface of the display panel and includes light-extraction structures and a peripheral structure, and the peripheral structure surrounds the light-extraction structures and has a refractive index smaller than a refractive index of each of the light-extraction structures. The light-emitting components include first-color light-emitting components, and an orthographic projection of one of the first-color light-emitting components on the substrate overlaps with an orthographic projection of one of the light-extraction structures on the substrate. In an embodiment, the light-extraction structures includes first light-extraction structures, and an orthographic projection of one of the first light-extraction structures on the substrate overlaps with an orthographic projection of one of the first-color light-emitting components on the substrate. The first light-extraction structures include first sidewalls including first sub-sidewalls and second sub-sidewalls. A maximum angle formed between a tangent plane of the first sub-sidewall and a plane of the substrate is a first angle $\alpha 1$, and a maximum angle formed between a tangent plane of the second sub-sidewall and the plane of the substrate is a second angle $\alpha 2$, where $\alpha 1 > \alpha 2$.

In a second aspect of the present disclosure, a display apparatus including the above display panel is provided.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. Based on these drawings, those skilled in the art can obtain other drawings without any creative effort.

DESCRIPTION OF EMBODIMENTS

In order to better understand technical solutions of the present disclosure, the embodiments of the present disclosure are described in detail with reference to the drawings.

It should be clear that the described embodiments are merely part of the embodiments of the present disclosure rather than all of the embodiments. All other embodiments obtained by those skilled in the art shall fall into the protection scope of the present disclosure.

The terms used in the embodiments of the present disclosure are merely for the purpose of describing specific embodiment, rather than limiting the present disclosure. The terms "a", "an", "the" and "said" in a singular form in an embodiment of the present disclosure and the attached claims are also intended to include plural forms thereof, unless otherwise noted.

It should be understood that the term "and/or" used in the context of the present disclosure is to describe a correlation relation of related objects, indicating that there can be three relations, e.g., A and/or B can indicate only A, both A and B, and only B. In addition, the symbol "/" in the context generally indicates that the relation between the objects in front and at the back of "/" is an "or" relationship.

In this specification, it should be understood that the terms "basically", "approximately", "about", "generally" and "substantially" described in claims and embodiments of the present disclosure refer to a substantially approved value, rather than an exact value, within a reasonable process operation range or tolerance range.

It should be understood that although the terms 'first', 'second' and 'third' can be used in the present disclosure to describe light-emitting components, light extraction modules, these light-emitting components and light extraction modules should not be limited to these terms. These terms are used only to distinguish the light-emitting components from each other and distinguish the light extraction modules from each other. For example, without departing from the scope of the embodiments of the present disclosure, a first light-emitting component can also be referred to as a second light-emitting component. Similarly, the second light-emitting component can also be referred to as the first light-emitting component.

Figure 1:
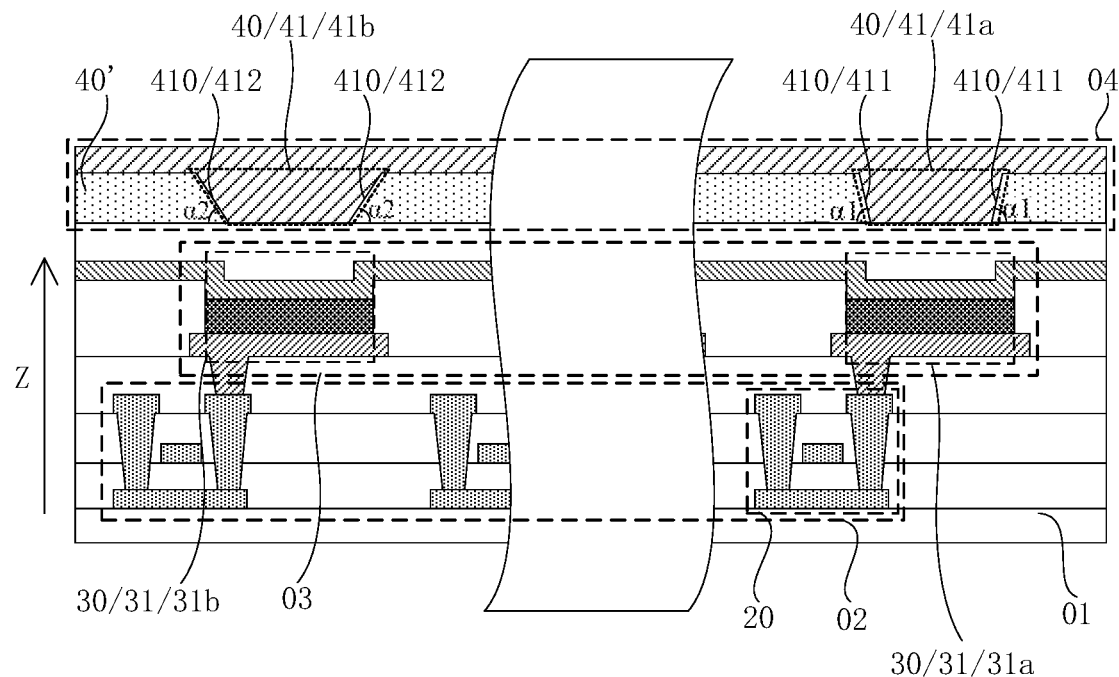
FIG. 1 is a schematic diagram showing a display panel according to an embodiment of the present disclosure.
Figure 2:
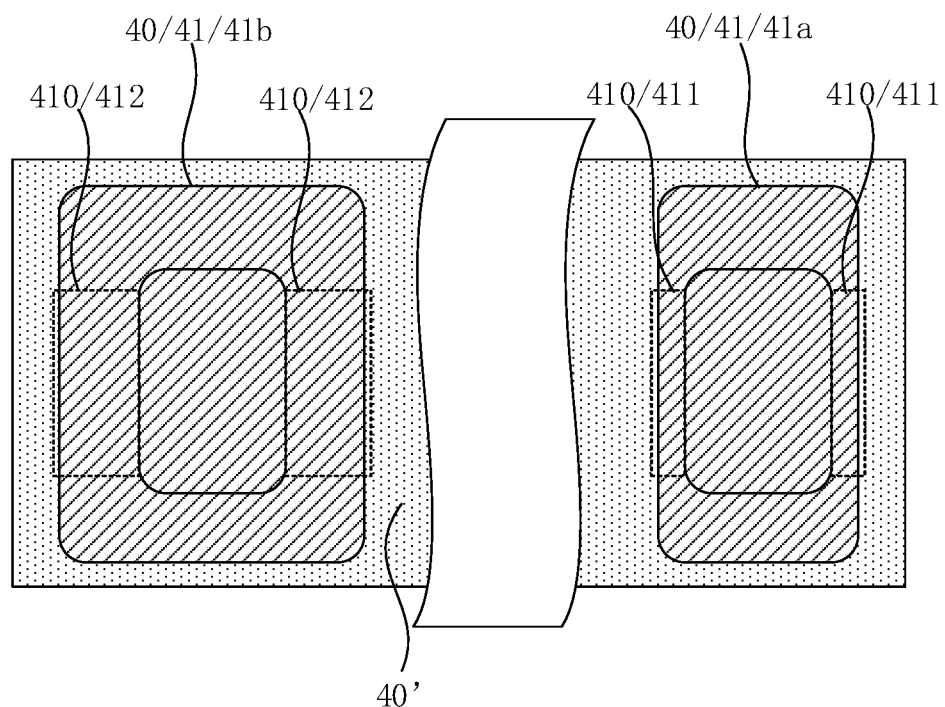
FIG. 2 is a schematic diagram showing an orthographic projection of the display panel shown in FIG. 1 according to an embodiment of the present disclosure.
Figure 3:
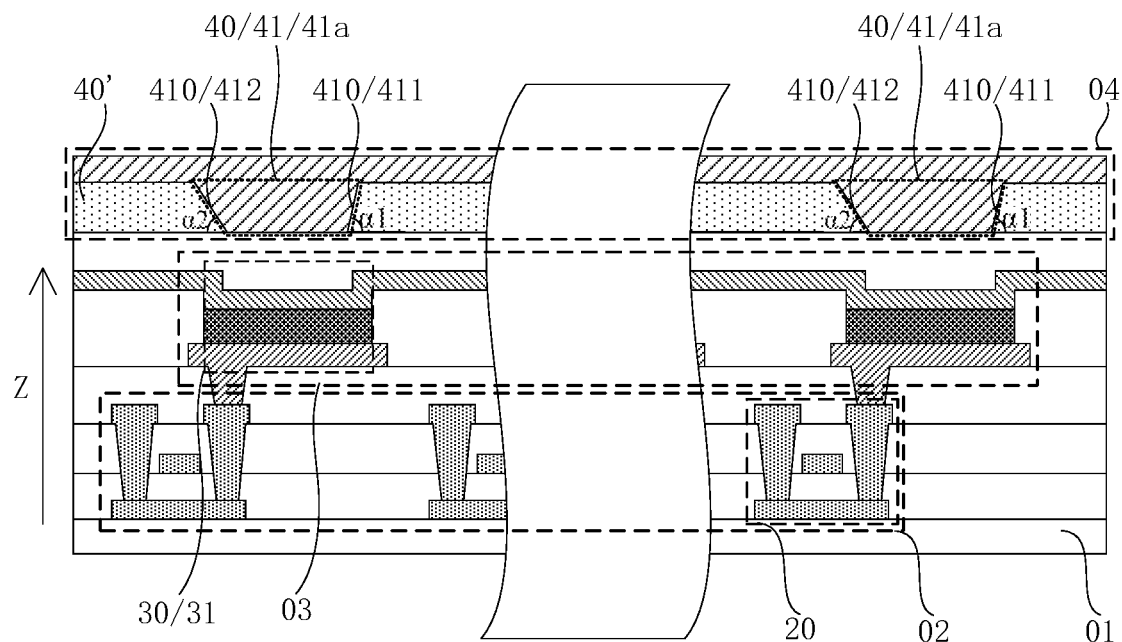
FIG. 3 is a schematic diagram showing a display panel according to another embodiment of the present disclosure.
Figure 4:
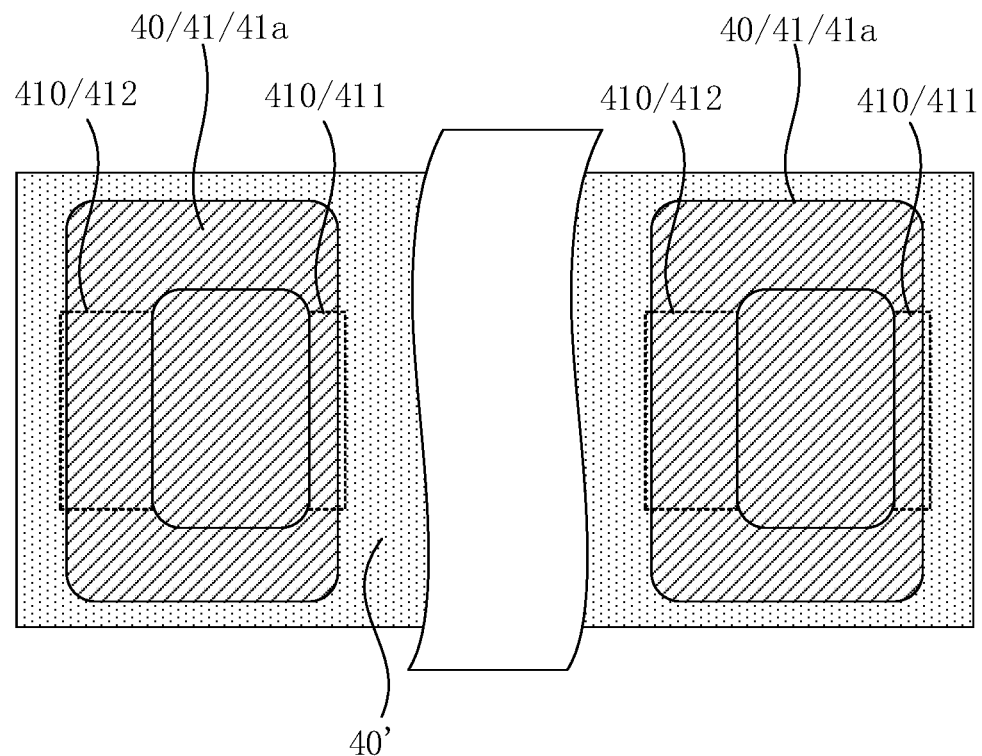
FIG. 4 is a schematic diagram showing an orthographic projection of the display panel shown in FIG. 3 according to an embodiment of the present disclosure.
Figure 5:
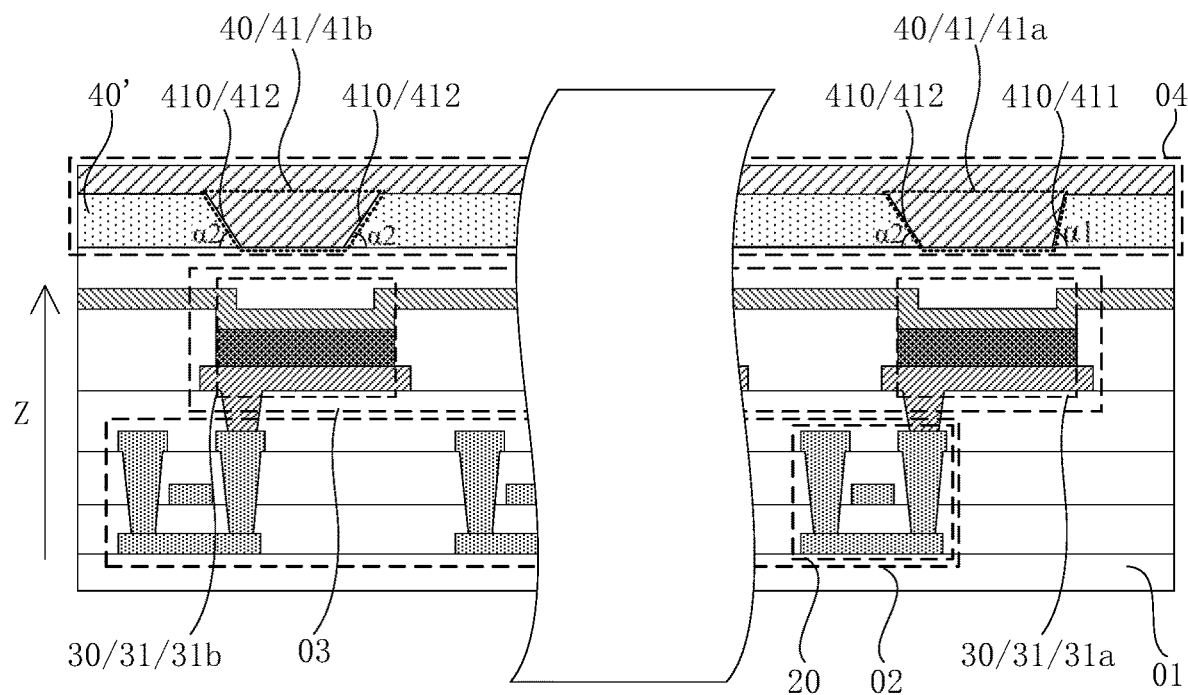
FIG. 5 is a schematic diagram showing a display panel according to another embodiment of the present disclosure.
Figure 6:
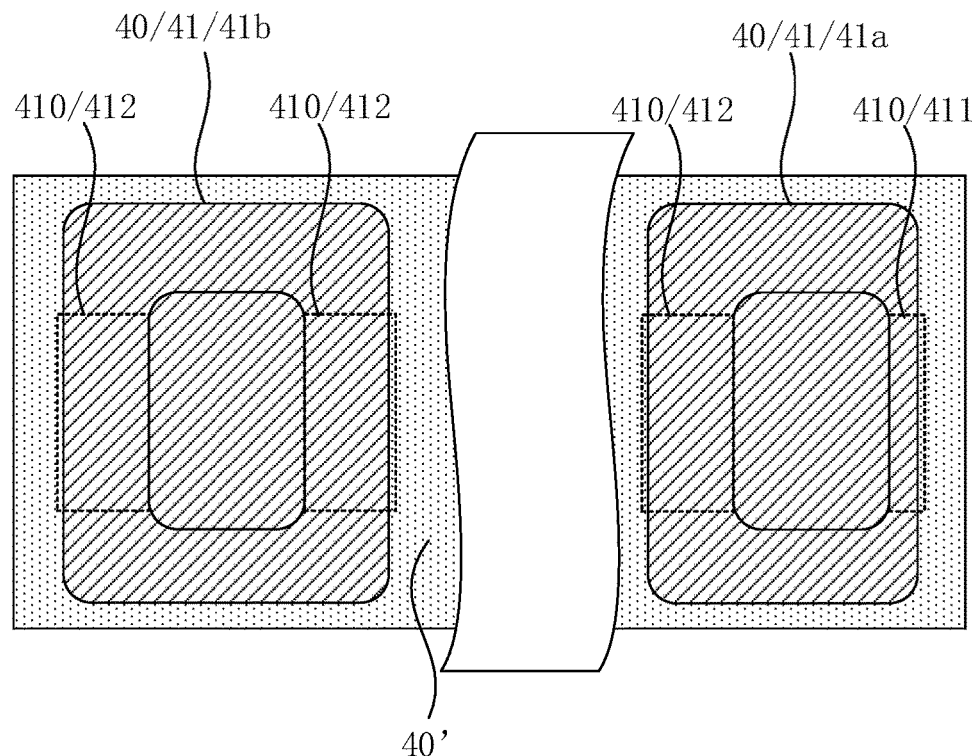
FIG. 6 is a schematic diagram showing an orthographic projection of the display panel shown in FIG. 5 according to an embodiment of the present disclosure.
Figure 7:
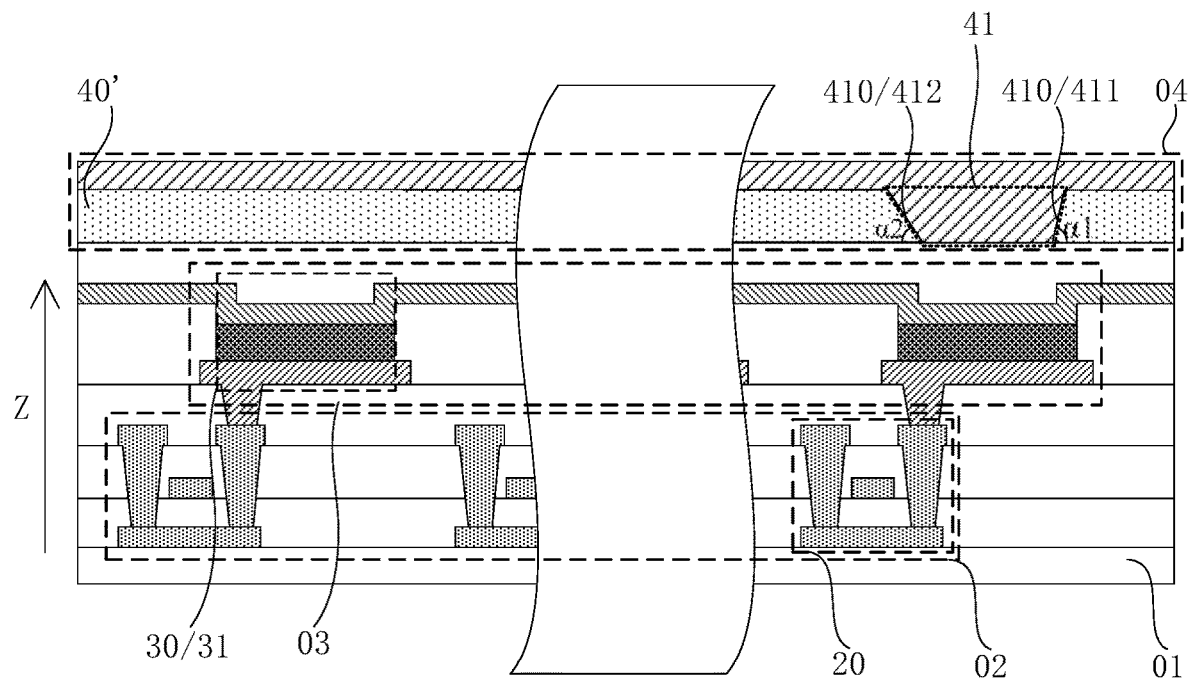
FIG. 7 is a schematic diagram showing a display panel according to another embodiment of the present disclosure.

FIG. 1 is a schematic diagram showing a display panel according to an embodiment of the present disclosure. FIG. 2 is a schematic diagram showing an orthographic projection of the display panel shown in FIG. 1 according to an embodiment of the present disclosure. FIG. 3 is a schematic diagram showing a display panel according to another embodiment of the present disclosure. FIG. 4 is a schematic diagram showing an orthographic projection of the display panel shown in FIG. 3 according to an embodiment of the present disclosure. FIG. 5 is a schematic diagram showing a display panel according to another embodiment of the present disclosure. FIG. 6 is a schematic diagram showing an orthographic projection of the display panel shown in FIG. 5 according to an embodiment of the present disclosure. FIG. 7 is a schematic diagram showing a display panel according to another embodiment of the present disclosure.

As shown in FIG. 1, FIG. 3, FIG. 5, and FIG. 7, the display panel provided by the present disclosure includes a substrate 01, a pixel circuit layer 02, a light-emitting component layer 03, and a light-extraction layer 04. The pixel circuit layer 02, the light-emitting component layer 03 and the light-extraction layer 04 are all provided at a side of the substrate 01 facing towards a light-emitting surface of the display panel. The light-emitting component layer 03 can be provided at a side of the pixel circuit layer 02 facing towards the light-emitting surface of the display panel. The light-extraction layer 04 is provided at a side of the light-emitting component layer 03 facing towards the light-emitting surface of the display panel.

The light-emitting component layer 03 includes a plurality of light-emitting components 30. The light-emitting component 30 can be an organic light-emitting component or a micro light-emitting diode.

The light-extraction layer 04 includes a plurality of light-extraction structures 40 and a peripheral structure 40'. The peripheral structure 40' surrounds the light-extraction structure 40, and has a refractive index smaller than the light-extraction structure 40. An interface formed between the light-extraction structure 40 and the peripheral structure 40' is an interface formed between an optically denser medium and an optically thinner medium.

The plurality of light-emitting components 30 includes a plurality of first-color light-emitting components 31. An orthographic projection of at least a part of the first-color light-emitting component 31 on the substrate 01 overlaps with an orthographic projection of the light-extraction structure 40 on the substrate 01. The plurality of light-extraction structures 40 includes a plurality of first light-extraction structures 41. An orthographic projection of the first light-extraction structure 41 on the substrate 01 overlaps with an orthographic projection of the first-color light-emitting component 31 on the substrate 01.

That is, among the first-color light-emitting components 31 and the first light-extraction structures 41 of the display panel, at least one first-color light-emitting component 31 corresponds to at least one first light-extraction structure 41 in a one-to-one correspondence and an orthographic projection of the at least one first-color light-emitting component 31 and an orthographic projection of the at least one first light-extraction structure 41 overlap. The first light-extraction structure 41 is configured to extract light emitted by the first-color light-emitting component 31 overlapping with the first light-extraction structure 41, increasing the light extraction efficiency of the first-color light. In addition, orthographic projections of at least one of the first-color light-emitting component 31 of the plurality of first-color light-emitting components 31 in the light-emitting component layer 03 on the substrate 01 overlaps with an orthographic projection of the light-extraction structure 40 on the substrate 01. For example, as shown in FIG. 1, FIG. 3, and FIG. 5, each of orthographic projections of all first-color light-emitting components 31 on the substrate 01 overlaps with an orthographic projection of the first light-extraction structure 41 on the substrate 01. For example, as shown in FIG. 7, an orthographic projection of at least one first-color light-emitting component 31 on the substrate 01 overlap with an orthographic projection of the first light-extraction structure 41 on the substrate 01, and an orthographic projection of another one of first-color light-emitting components 31 on the substrate 01 does not overlap with an orthographic projection of the first light-extraction structure 41 on the substrate 01.

In addition, as shown in FIG. 1 to FIG. 7, the plurality of first light-extraction structures 41 includes a plurality of first sidewalls 410. As shown in FIG. 1, FIG. 3, and FIG. 5, a surface in contact with the peripheral structure 40' close thereto in the first light-extraction structure 41 can be regarded as a first sidewall 410 of the first light-extraction structure 41. The first sidewall 410 can be inclined towards a direction away from a center line of the first light-extraction structure 41 along a direction from the first-color light-emitting component 31 to the first light-extraction structure 41. That is, an area of a top surface of the first light-extraction structure 41 facing away from the first-color light-emitting component 31 is larger than an area of a bottom surface of the first light-extraction structure 41 facing towards the first-color light-emitting component 31. The center line of the first light-extraction structure 41 can be a straight line perpendicular to the bottom surface of the first light-extraction structure 41 and passing through a center point of the bottom surface of the first light-extraction structure 41. The top surface of the first light-extraction structure 41 is a surface of the light-extraction structure 41 facing away from the first-color light-emitting component 31, and the bottom surface of the first light-extraction structure 41 is a surface of the first light-extraction structure 41 facing towards the first-color light-emitting component 31.

The plurality of first sidewalls 410 included in the plurality of first light-extraction structures 41 includes a first sub-sidewall 411 and a second sub-sidewall 412. A maximum angle formed between a tangent plane of the first sub-sidewall 411 and a plane of the substrate 01 is a first angle $\alpha 1$, and a maximum angle formed between the tangent plane of the second sub-sidewall 412 and the plane of the substrate 01 is a second angle $\alpha 2$, where $\alpha 1 > \alpha 2$. That is, the plurality of first sidewalls 410 included in the plurality of first light-extraction structures 41 includes first sidewalls 410 with at least two different inclination angles.

In the present disclosure, the angles of the first light-extraction structures corresponding to the light-emitting components (first-color light-emitting components) of same color are different, so that on the one hand, the light extraction efficiency of the display panel can be improved, and on the other hand, the color gamut of the light emitted by the light-emitting components of same color can be changed, thereby balancing the light extraction efficiency and color cast of a same one display panel.

Figure 8:
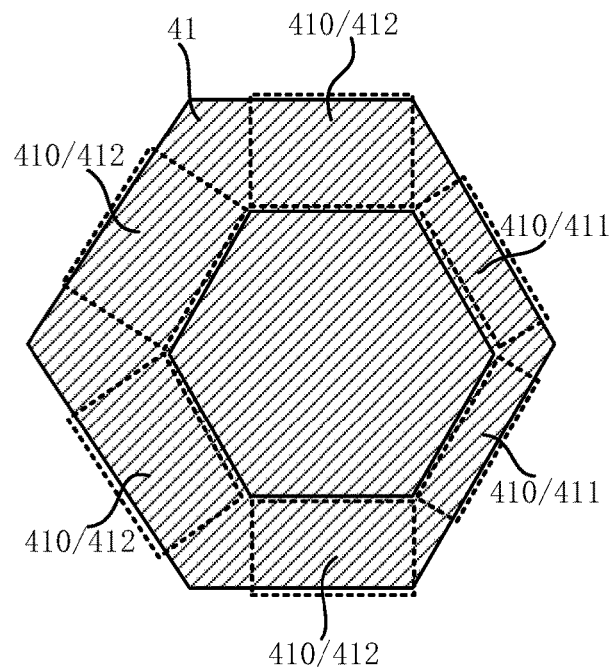
FIG. 8 is a plan view of a first light-extraction structure according to an embodiment of the present disclosure.

FIG. 8 is a plan view of a first light-extraction structure according to an embodiment of the present disclosure.

It should be noted that one first light-extraction structure 41 includes at least two first sidewalls 410. For example, as shown in FIG. 2, FIG. 4, and FIG. 6, when an orthographic projection of the first light-extraction structure 41 is rectangular, the first light-extraction structure 41 can include four first sidewalls 410. For example, as shown in FIG. 8, when the orthographic projection of the first light-extraction structure 41 is hexagon, the first light-extraction structure 41 can include six first sidewalls 410.

When the orthographic projection of the first light-extraction structure 41 is circular, the first light-extraction structure 41 can include a first sidewall 410 surrounding the first light-extraction structure 41, and has a same inclination angles at different positions of the first sidewall 410. The "different positions" here refers to different positions in a direction surrounding the first light-extraction structure 41. When the orthographic projection of the first light-extraction structure 41 is circular, the first light-extraction structure 41 can also include at least two first sidewalls 410 having different inclination angles, which are arranged in a direction surrounding the first light-extraction structure 41.

Therefore, the plurality of first sidewalls 410 of the plurality of first light-extraction structures 41 refers to that, if each first light-extraction structure 41 includes n first sidewalls 410, m light-extraction structures include n*m first sidewalls 410, where n=1 or n≥2, and m≥2. It should be noted that the number of the first sidewalls 410 can be different or the same in different first light-extraction structures 41.

Figure 9:
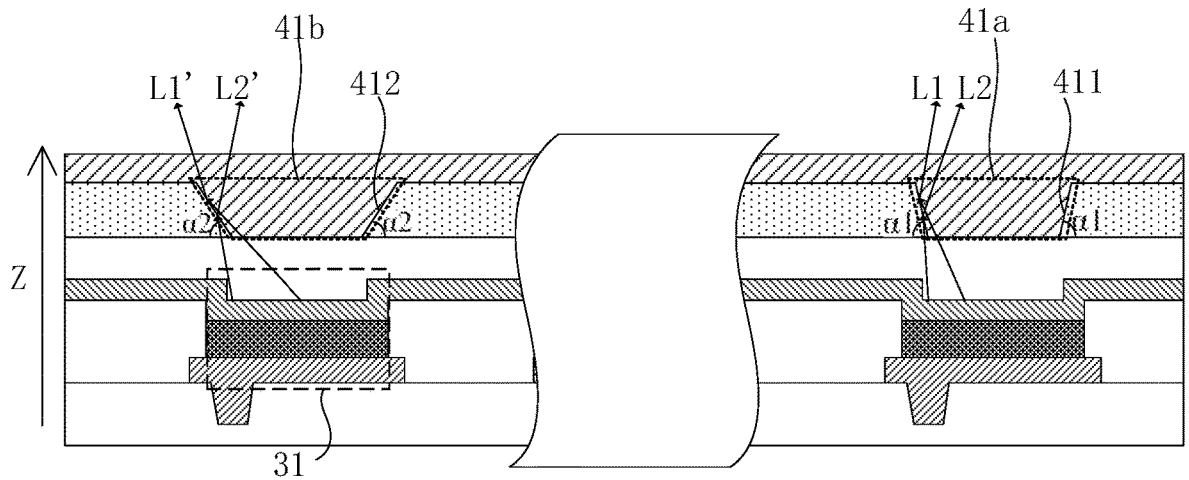
FIG. 9 is a schematic diagram showing an effect of a light-extraction structure of a display panel according to an embodiment of the present disclosure.

FIG. 9 is a schematic diagram showing an effect of a light-extraction structure of a display panel according to an embodiment of the present disclosure.

As shown in FIG. 9, among the light emitted by the first-color light-emitting component 31, a proportion of reflection of the light with a smaller inclination angle that are reflected at the first sidewall 410 of the first light-extraction structure 41 is improved relative to a proportion of reflection that occurs at the sidewall having a smaller inclination angle. The light with a larger inclination angle that is close to the edge of the first-color light-emitting component 31 first passes through the peripheral structure 40' and then passes through the first light-extraction structure 41, so that it is refracted at the first sidewall 410. Taking the light shown in FIG. 9 as an example, light L1 and light L1' are both emitted by the first-color light-emitting component 31 and then reflected by the first sidewall 410. Light L2 and light L2' are both emitted by the first-color light-emitting component 31 and then refracted at the first sidewall 410. The inclination angle mentioned in this disclosure can be an inclination angle relative to the plane of the substrate 01.

The light L1 is emitted by the first-color light-emitting component 31 and reflected by the first sub-sidewall 411, and then emits toward a direction of front viewing angle of the sub-pixel corresponding to the first-color light-emitting component 31. Therefore, when light having a smaller inclination angle than the light L1 reaches the first sub-sidewall 411, it can also emit toward the direction of front viewing angle of the sub-pixel corresponding to the first-color light-emitting component 31. However, since the inclination angle of the light L1' is smaller than that of the light L1, and the light L1' is emitted to the second sub-sidewall 412 with a smaller inclination angle, although it is reflected, its emitting angle is far away from the front viewing angle.

That is, among the light emitted by the first-color light-emitting component 31 and the first sidewall 410, the amount of the light reflected by the first sub-sidewall 411 to the front viewing angle is greater than that of the light reflected by the second sub-sidewall 412 to the front viewing angle. Correspondingly, the amount of light refracted at the first sub-sidewall 411 to the front viewing angle is smaller than the amount of light refracted at the second sub-sidewall 412 to the front viewing angle. On the one hand, by providing the first sub-sidewall 411 at the first sidewall 410, the amount of light reaching the front viewing angle through reflection can be increased while reducing the amount of light reaching the front viewing angle through refraction, so that a color cast caused by refraction is reduced correspondingly, thereby improving the light extraction efficiency of the display panel and alleviating the color cast of the display panel.

It should be noted that in the present disclosure, a first angle $\alpha 1$ and a second angle $\alpha 2$ are used to indicate different inclination angles of the first sub-sidewall and the second sub-sidewall. When determining the first angle $\alpha 1$ and the second angle $\alpha 2$, you can first determine a height of the position with the maximum inclination angle in the first sidewall along a thickness direction of the display panel; then determine the tangent planes of the first sub-sidewall 411 and the second sub-sidewall 412; and then determine the angles formed between the two tangent planes and the plane of the substrate 01 as the first angle α1 and the second angle α2, respectively.

In an embodiment of the present disclosure, as shown in FIG. 1, FIG. 3, and FIG. 5, the first sidewall is a planar structure. That is, the first sub-sidewall 411 and the second sub-sidewall 412 are both the planar structure. Therefore, the tangent planes at all positions of the first sub-sidewall 411 are coplanar, and the tangent planes at all positions of the second sub-sidewall 412 are coplanar.

Figure 10:
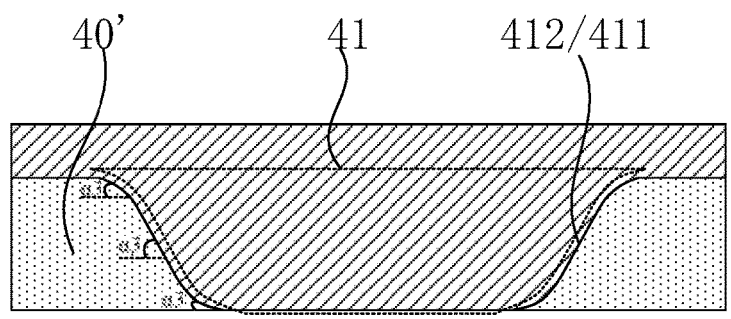
FIG. 10 is a schematic diagram showing a first light-extraction structure according to an embodiment of the present disclosure.

FIG. 10 is a schematic diagram showing a first light-extraction structure according to an embodiment of the present disclosure.

In an embodiment of the present disclosure, as shown in FIG. 10, the first sidewall of the first light-extraction structure 40 is a first curved structure, and an angle formed between the tangent plane of the first curved structure and the plane of the substrate 01 is a third angle α3. The third angle α3 is firstly increased and then decreased in a direction from the first-color light-emitting component 31 to the corresponding first light-extraction structure 41. As shown in FIG. 10, a bottom surface with a smaller area is provided at a side of the first light-extraction structure 40 facing towards the first-color light-emitting component 31, and a top surface with a larger area is provided at a side of the first light-extraction structure 40 facing away from the first-color light-emitting component 31. In the first sidewall of the first light-extraction structure 40, a portion close to the top surface and a portion close to the bottom surface have a relatively gentle slope relative to a portion at the middle position.

Figure 11:
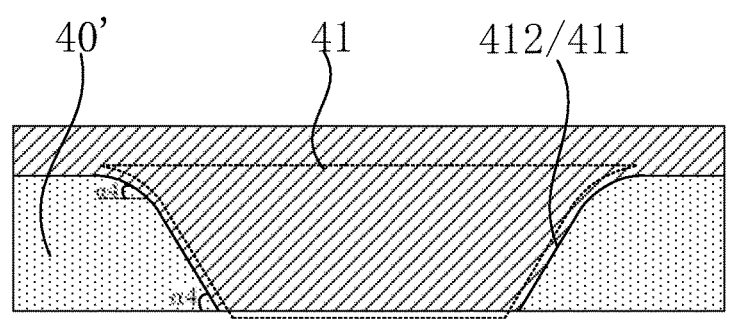
FIG. 11 is a schematic diagram showing a first light-extraction structure according to another embodiment of the present disclosure.

FIG. 11 is a schematic diagram showing a first light-extraction structure according to another embodiment of the present disclosure.

In an embodiment of the present disclosure, as shown in FIG. 11, the first sidewall of the first light-extraction structure 40 is a second curved structure, and an angle formed between the tangent plane of the second curved structure and the plane of the substrate 01 is a fourth angle α4. The first angle is gradually decreased in a direction from the first-color light-emitting component 31 to the corresponding first light-extraction structure 40. As shown in FIG. 11, a bottom surface with a smaller area is provided at a side of the first light-extraction structure 40 facing towards the first-color light-emitting component 31, and a top surface with a larger area is provided at a side of the first light-extraction structure 40 facing away from the first-color light-emitting component 31. In the first sidewall of the first light-extraction structure 40, a portion close to the top surface has a relatively gentle slope.

In an embodiment of the present disclosure, $75° \geq \alpha1 \geq 65°$, and $55° \geq \alpha2 \geq 45°$. That is, the first sub-sidewall 411 has an inclination angle in a range from 65° to 75°, and the second sub-sidewall 412 has an inclination angle in a range from 65° to 75°.

Figure 12:
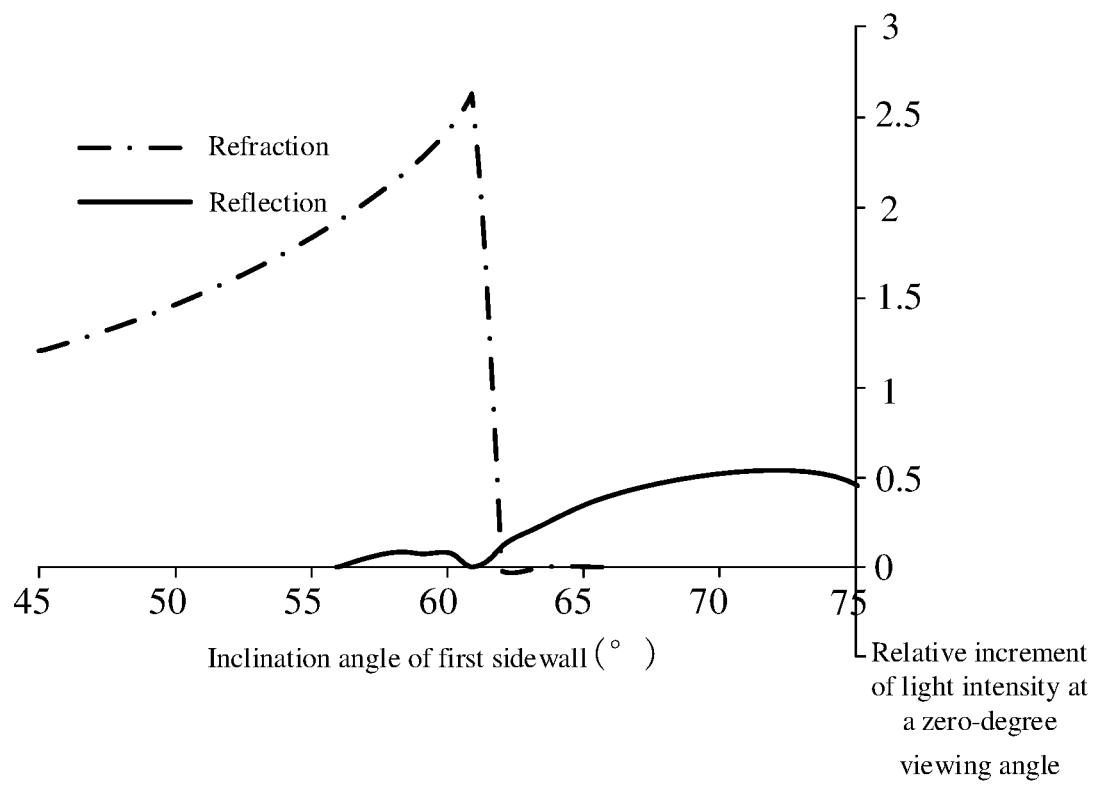
FIG. 12 is a graph showing influence of different inclination angles of the first sidewall on light intensity at a zero-degree viewing angle.

FIG. 12 is a graph showing influence of different inclination angles of the first sidewall on the light intensity at a zero-degree viewing angle.

As shown in FIG. 12, when an inclination angle of the first sub-sidewall 411 is in the range from 65° to 75°, increase in light intensity at a zero-degree viewing angle mainly depends on reflection effect of the first sub-sidewall 411 on light, and the first sub-sidewall 411 reduces refraction of light and reduces color cast at a large viewing angle. When the inclination angle of the second sub-sidewall 412 is in the range from 45° to 55°, increase in light intensity at a zero-degree viewing angle mainly depends on refraction effect of the second sub-sidewall 412 on light. Since the increase of light intensity at the zero-degree viewing angle by refraction effect is obviously originated from the increase of light intensity at the zero-degree viewing angle by reflection effect, overall brightness of the first-color light can be achieved with the second sub-sidewall.

In an embodiment of the present disclosure, as shown in FIG. 1 and FIG. 2, the plurality of first light-extraction structures 41 in the light-extraction layer 04 includes at least one first light-extraction sub-structure 41a and at least one second light-extraction sub-structure 41b. The first light-extraction sub-structure 41a and the second light-extraction sub-structure 41b overlap with the light-emitting components 31 having different first-colors, respectively. For example, the plurality of first-color light-emitting components 31 includes a first-color light-emitting component 31a and a first-color light-emitting component 31b. The first light-extraction sub-structure 41a overlaps with the first-color light-emitting component 31a, and the second light-extraction sub-structure 41b overlaps with the first-color light-emitting component 31b.

The first sidewalls 410 of the first light-extraction sub-structure 41a are all first sub-sidewalls 411, and the first sidewalls 410 of the second light-extraction sub-structure 41b are all second sub-sidewalls 412. That is, among the plurality of first light-extraction structures 41, the inclination angles of first sidewalls 410 in any one of the first light-extraction structures 41 are the same, the inclination angles of the first sidewalls 410 of at least one first light-extraction structure 41 are relatively large, and the inclination angles of the first sidewalls 410 in another one of the first light-extraction structures 41 are relatively small.

In an embodiment of the present disclosure, as shown in FIG. 3 to FIG. 7, the plurality of first light-extraction structures 41 of the light-extraction layer 04 includes a first light-extraction sub-structure 41a. The first sidewalls 410 of a same one first light-extraction sub-structure 41a include a first sub-sidewall 411 and a second sub-sidewall 412. That is, in at least one of the first light-extraction structures 41 of the plurality of first light-extraction structures 41, any one of the first light-extraction structures 41 includes at least two types of first sidewalls 410 with different inclination angles.

In an embodiment of the present disclosure, as shown in FIG. 3 and FIG. 4, the plurality of first light-extraction structures 41 in the light-extraction layer 04 are all the first light-extraction sub-structures 41a, that is, any one of all first light-extraction structures 41 includes the first sub-sidewall 411 and the second sub-sidewall 412.

In another embodiment of the present disclosure, as shown in FIG. 5 and FIG. 6, a first light-extraction structure 41 in the light-extraction layer 04 includes the first light-extraction sub-structure 41a and a second light-extraction sub-structure 41b. The first light-extraction sub-structure 41a and the second light-extraction sub-structure 41b overlap with the light-emitting components 31 having different first-colors, respectively. For example, a first-color light-emitting component 31 includes a first-color light-emitting component 31a and a first-color light-emitting component 31b. The first light-extraction sub-structure 41a overlaps with the first-color light-emitting component 31a, and the second light-extraction sub-structure 41b overlaps with the first-color light-emitting component 31b.

In an embodiment of the present disclosure, referring to FIG. 5 and FIG. 6, among the plurality of second light-extraction sub-structures 41b in the light-extraction layer 04, the sidewalls in any one of the second light-extraction sub-structures 41b are all second sub-sidewall 412. That is, among the plurality of first light-extraction structures 41, at least one of the first light-extraction structures 41 includes first sidewalls 410 with different inclination angles, and another one of the first light-extraction structures 41 includes first sidewalls 410 with a same inclination angle.

Figure 13:
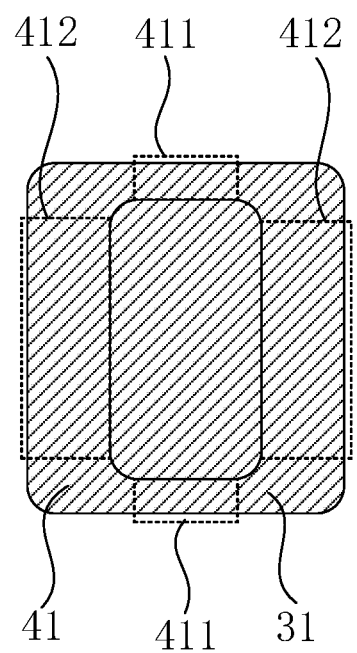
FIG. 13 is a schematic diagram showing orthographic projections of a first light-extraction structure and a first-color light-emitting component of a display panel according to an embodiment of the present disclosure.

FIG. 13 is a schematic diagram showing orthographic projections of a first light-extraction structure and a first-color light-emitting component of a display panel according to an embodiment of the present disclosure.

In an embodiment of the present disclosure, as shown in FIG. 13, when one first light-extraction structure 41 includes both the first sub-sidewall 411 and the second sub-sidewall 412, a length of an edge of the first-color light-emitting component 31 corresponding to the first sub-sidewall 411 is smaller than a length of an edge of the first-color light-emitting component 31 corresponding to the second sub-sidewall 412. That is, when the first light-extraction sub-structure 41a at least includes sidewalls with two inclination angles, in the first light-extraction sub-structure 41a and the first-color light-emitting component 31 covered by the first extraction sub-structure 41a, the first sub-sidewall 411 with a large inclination angle is provided at a same side as a short side of the first-color light-emitting component 31, and the second sub-sidewall 412 with a small inclination angle is provided at a same side as a long side of the first-color light-emitting component 31.

In an embodiment of the present disclosure, as shown in FIG. 13, when one first light-extraction structure 41 includes both the first sub-sidewall 411 and the second sub-sidewall 412, the first sub-sidewall 411 is arranged adjacent to the second sub-sidewall 412. That is, when the first light-extraction sub-structure 41a at least includes the first sub-sidewall 411 and the second sub-sidewall 412 that have two inclination angles, the first sub-sidewall 411 with a large inclination angle is arranged adjacent to the second sub-sidewalls 412 with a small inclination angle.

Figure 14:
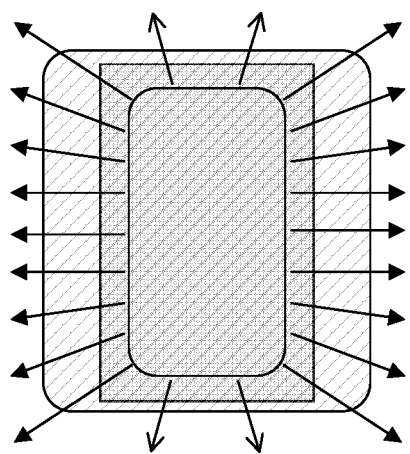
FIG. 14 is a schematic diagram showing an effect corresponding to FIG. 13 according to an embodiment of the present disclosure.

FIG. 14 is a schematic diagram showing an effect corresponding to FIG. 13 according to an embodiment of the present disclosure.

It can be seen from the above analysis that, an increment of light intensity under zero-degree viewing angle obtained by the first sub-sidewall 411 mainly increasing reflection effect is smaller than an increment of light intensity under zero-degree viewing angle obtained by the second sub-sidewall 412 mainly increasing refraction effect, so that arranging the first sub-sidewall 411 and the second sub-sidewall 412 adjacent to each other in one light-extraction structure 41 can achieve basically the same light intensity at different positions and viewing angles. For example, the light obtained by the first sidewall 410 from the upward viewing angle includes, in addition to the light reflected by the first sub-sidewall 411 at an upper position of the first light-extraction structure 41, the light refracted by the second sub-sidewall 412 on the left and right sides, thereby achieving the light intensity at the upward viewing angle.

In the above embodiments, when the plurality of first light-extraction structures 41 of the light-extraction layer 04 includes both the first light-extraction sub-structure 41a and the second light-extraction sub-structure 41b, the number n1 of the first light-extraction sub-structure 41a and the number n2 of the second light-extraction sub-structure 41b satisfy $|(n1-n2)/(n1+n2)|\leq 20\%$, so that the number difference between the first light-extraction sub-structure 41a and the second light-extraction sub-structure 41b is controlled within 20%, thereby balancing the light extraction efficiency and color cast of the display panel. In an embodiment, n1=n2, i.e., the number of first light-extraction sub-structure 41a is equal to the number of second light-extraction sub-structure 41b.

Figure 15:
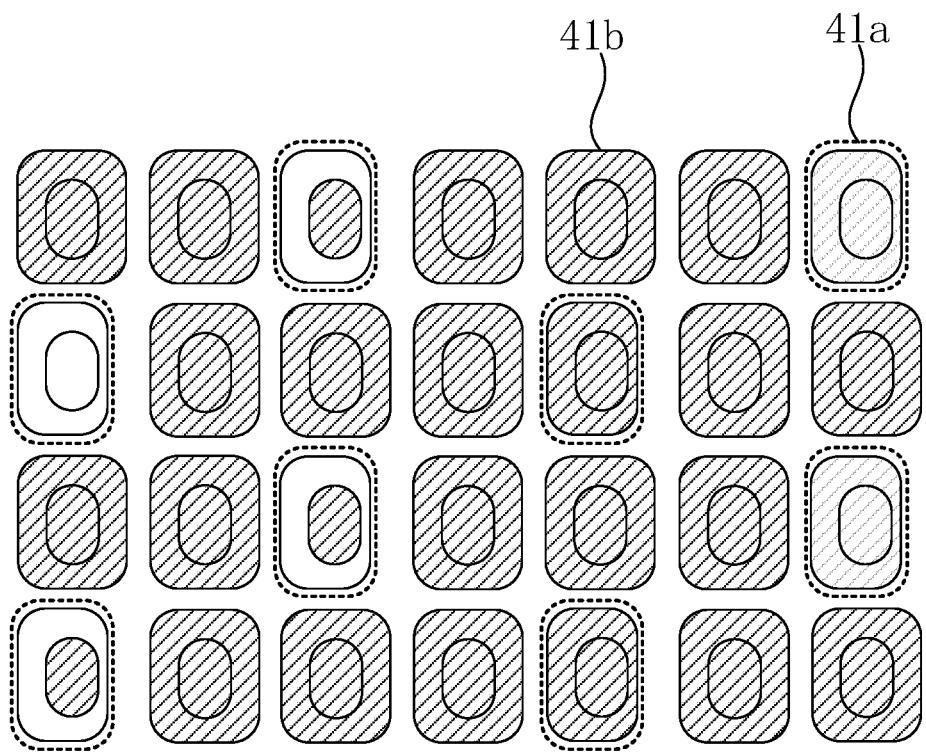
FIG. 15 is a schematic diagram showing a layout of a light-extraction structure of a display panel according to an embodiment of the present disclosure.
Figure 16:
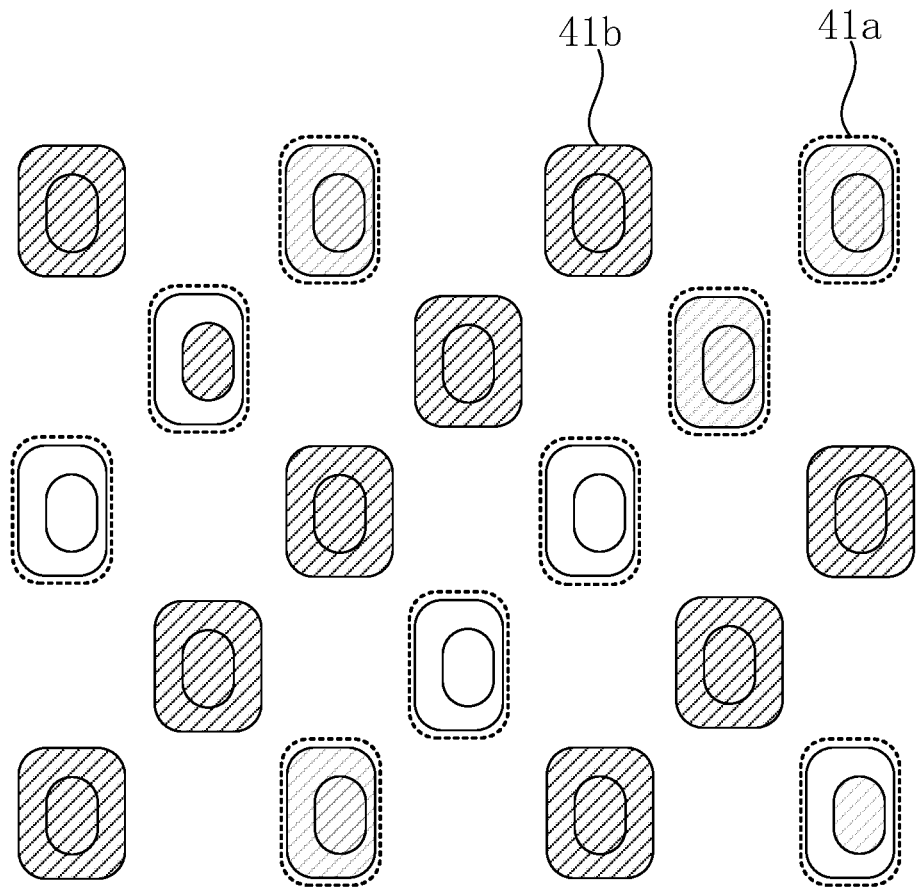
FIG. 16 is a schematic diagram showing a layout of a light-extraction structure of a display panel according to another embodiment of the present disclosure.

FIG. 15 is a schematic diagram showing a layout of a light-extraction structure of a display panel according to an embodiment of the present disclosure. FIG. 16 is a schematic diagram showing a layout of a light-extraction structure of a display panel according to another embodiment of the present disclosure.

In an embodiment of the present disclosure, regardless of whether the first light-extraction sub-structure 41a includes both the first sub-sidewall 411 and the second sub-sidewall 412, or only includes the first sub-sidewall 411, m second light-extraction sub-structures 41b are provided between two adjacent first light-extraction sub-structures 41a, where $1\leq m\leq 5$, and m is a positive integer. That is, at least one second light-extraction sub-structure 41b is provided between two adjacent first light-extraction sub-structures 41a.

For example, as shown in FIG. 15, three second light-extraction sub-structures 41b are provided between two first light-extraction sub-structures 41a that are adjacent to each other in a row direction. One second light-extraction sub-structures 41b is provided between two first light-extraction sub-structures 41a that are adjacent to each other in a column direction.

For example, as shown in FIG. 16, one second light-extraction sub-structure 41b is provided between two adjacent first light-extraction sub-structures 41a, and one first light-extraction sub-structure 41a is provided between two adjacent second light-extraction sub-structures 41b. That is, the first light-extraction sub-structures 41a and the second light-extraction sub-structures 41b are spaced apart from each other.

In an embodiment of the present disclosure, if the first-color light-emitting component 31 is a blue light-emitting component, the first light-extraction structure 41 is provided at a side of a light-emitting surface of the first-color light-emitting component 31.

Since the light extraction efficiency of the blue light-emitting component is relatively low, by arranging the first light-extraction structure 41 above at least part of the blue light-emitting component, the brightness of the display panel can be increased while not significantly aggravating color cast at a viewing angle.

Figure 17:
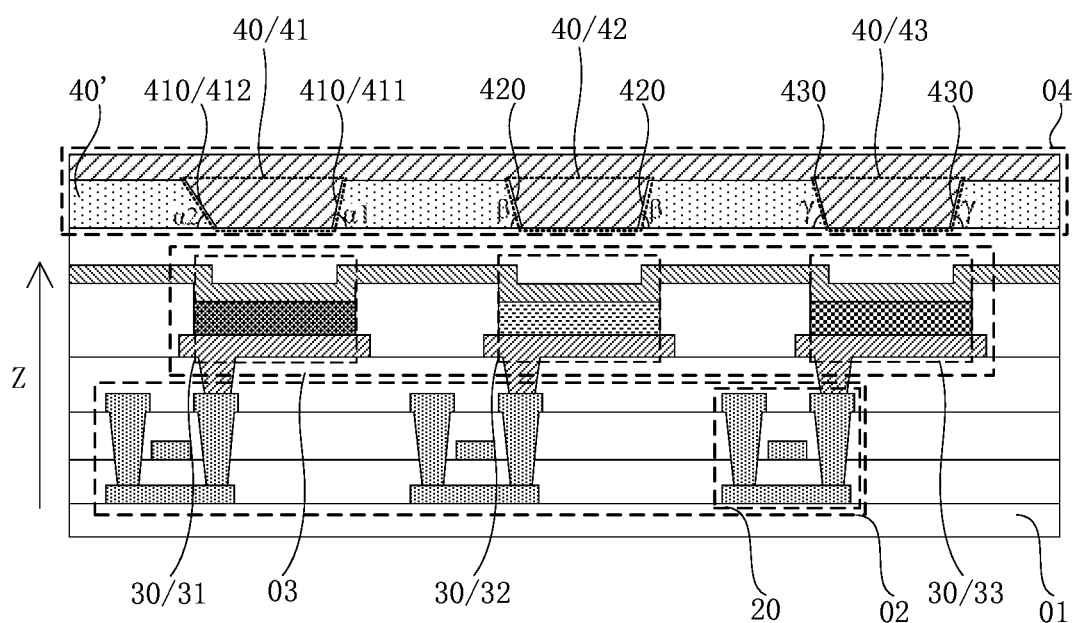
FIG. 17 is a schematic diagram showing a display panel according to another embodiment of the present disclosure.
Figure 18:
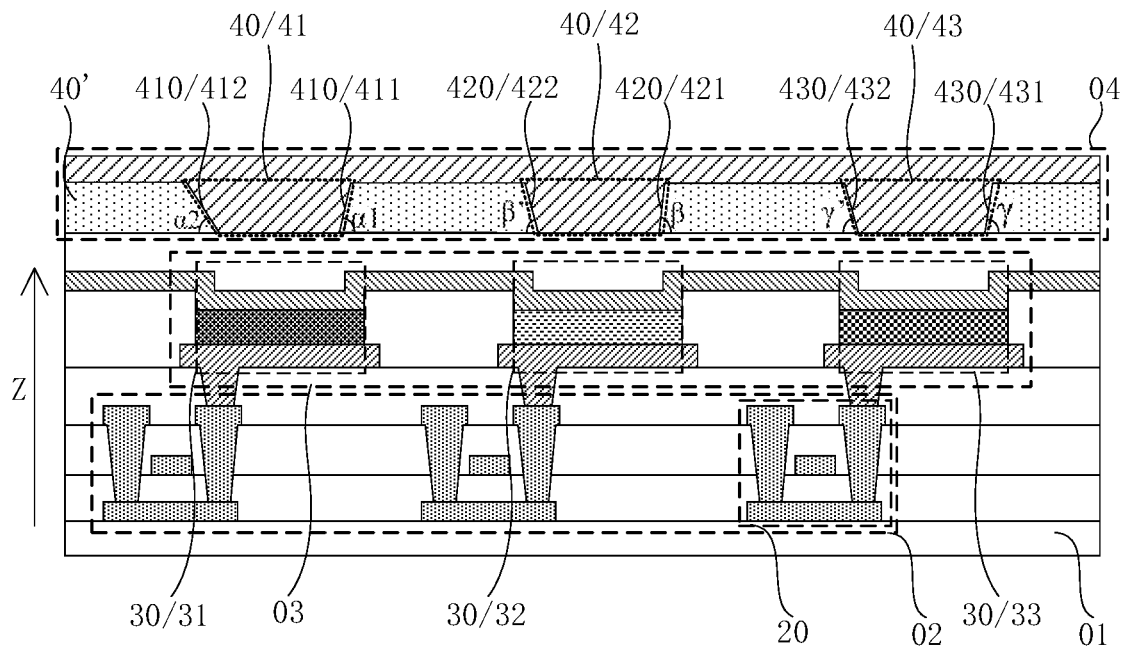
FIG. 18 is a schematic diagram showing a display panel according to another embodiment of the present disclosure.

FIG. 17 is a schematic diagram showing a display panel according to another embodiment of the present disclosure, and FIG. 18 is a schematic diagram showing a display panel according to another embodiment of the present disclosure.

In an embodiment of the present disclosure, as shown in FIG. 17 and FIG. 18, the plurality of light-emitting components 30 included in the light-emitting component layer 03 further includes a red light-emitting component 32 and a green light-emitting component 33. An orthographic projection of at least one of the red light-emitting component 32 on the substrate 01 overlaps with an orthographic projection of the light-extraction structure 40 on the substrate 01. An orthographic projection of at least one of the green light-emitting component 33 on the substrate 01 overlaps with an orthographic projection of the light-extraction structure 40 on the substrate 01.

The plurality of light-extraction structures 40 in the light-extraction layer 04 includes a plurality of second light-extraction structures 42 and a plurality of third light-extraction structures 43. An orthographic projection of the second light-extraction structure 42 on the substrate 01 overlaps with an orthographic projection of the red light-emitting component 32 on the substrate 01. An orthographic projection of the third light-extraction structure 43 on the substrate 01 overlaps with an orthographic projection of the green light-emitting component 33 on the substrate 01.

That is, among the red light-emitting components 32 and the second light-extraction structures 42 in the display panel, at least one red light-emitting component 32 corresponds to at least one second light-extraction structure 42 in one-to-one correspondence, and their orthographic projections overlaps. Among the green light-emitting components 33 and the third light-extraction structures 43 in the display panel, at least one green light-emitting component 33 corresponds to at least one third light-extraction structures 43 in one-to-one correspondence, and their orthographic projections overlap.

An orthographic projection of at least one of the red light-emitting components 32 of the plurality of red light-emitting components 32 on the substrate 01 overlaps with an orthographic projection of the light-extraction structure 40 on the substrate 01. For example, each of orthographic projections of all red light-emitting components 32 on the substrate 01 overlaps with an orthographic projection of one second light-extraction structure 42 on the substrate 01. For example, an orthographic projection of each of at least one of the red light-emitting components 32 on the substrate 01 overlap with an orthographic projection of the second light-extraction structure 42 on the substrate 01, and an orthographic projection of another one of the red light-emitting components 32 on the substrate 01 does not overlap with an orthographic projection of the second light-extraction structure 42 on the substrate 01.

An orthographic projection of at least one of the green light-emitting components 33 of the plurality of green light-emitting components 33 on the substrate 01 overlaps with the orthographic projection of the light-extraction structure 40 on the substrate 01. For example, each of orthographic projections of all green light-emitting components 33 on the substrate 01 overlaps with an orthographic projection of one third light-extraction structure 43 on the substrate 01. For example, an orthographic projection of at least one of the green light-emitting components 33 on the substrate 01 overlaps with an orthographic projection of the third light-extraction structure 43 on the substrate 01, and an orthographic projection of another one of the green light-emitting components 33 on the substrate 01 does not overlap with the orthographic projection of the third light-extraction structure 43 on the substrate 01.

The plurality of second light-extraction structures 42 includes a plurality of second sidewalls 420. As shown in FIG. 17 and FIG. 18, a surface of the second light-extraction structure 42 in contact with the peripheral structure 40' close to the second light-extraction structure 42 can be regarded as the second sidewall 420 of the second light-extraction structure 42. Along a direction from the red light-emitting component 32 toward the second light-extraction structure 42, the second sidewall 420 is inclined away from a center line of the second light-extraction structure 42.

In an embodiment, the plurality of third light-extraction structures 43 includes a plurality of third sidewalls 430. As shown in FIG. 17 and FIG. 18, a surface of the third light-extraction structure 43 in contact with the peripheral structure 40' close to the third light-extraction structure 43 can be regarded as the third sidewall 430 of the third light-extraction structure 43. Along a direction from the green light-emitting component 33 toward the third light-extraction structure 43, the third sidewall 430 is inclined away from a center line of the third light-extraction structure 43.

Referring to FIG. 17 and FIG. 18, among the plurality of second sidewalls 420 of the plurality of second light-extraction structures 42, a maximum angle formed between a tangent plane of the second sidewall 420 and the plane of the substrate 01 is a third angle $\beta$, where $\beta \geq \alpha 1$. That is, an inclination degree of the sidewall having the maximum inclination angle of the second light-extraction structure 42 corresponding to the red light-emitting component 32 is greater than an inclination degree of the sidewall having the maximum inclination angle of the first light-extraction structure 41 corresponding to the blue light-emitting component.

That is, the reflection effect of the second sidewall 420 on red light is greater than the reflection effect of the first sidewall 410 on blue light, and the refraction effect of the second sidewall 420 on red light is smaller than that of the first sidewall 410 on blue light. On the one hand, the color cast at the large viewing angle of the display panel can be further reduced by reducing the refraction effect for red light. On the other hand, since the light extraction efficiency of the red light-emitting component is higher than that of the blue light-emitting component, the inclination angle of the first sidewall 410 of the first light-extraction structure 41 above the blue light-emitting component is set relative to the inclination angle of the second sidewall 420 of the second light-extraction structure 42 on the red light-emitting component, which can balance brightness of blue light and red light, achieving white balance.

Referring to FIG. 17 and FIG. 18, for the plurality of third sidewalls 430 of the plurality of third light-extraction structures 43, the maximum angle formed between the tangent plane of the third sidewall 430 and the plane of the substrate 01 is a fourth angle $\gamma$, where $\gamma \geq \alpha 1$. That is, the inclination degree of the sidewall having the maximum inclination angle in the third light-extraction structure 43 corresponding to the green light-emitting component 33 is greater than that of the sidewall having the maximum inclination angle in the first light-extraction structure 41 corresponding to the blue light-emitting component.

That is, the reflection effect of the third sidewall 430 on green light is greater than the reflection effect of the first sidewall 410 on blue light, and the refraction effect of the third sidewall 430 on green light is smaller than that of the first sidewall 410 on blue light. On the one hand, the color cast at a large viewing angle of the display panel can be further reduced by reducing the refraction of green light. On the other hand, since the light extraction efficiency of the green light-emitting component is higher than that of the blue light-emitting component, the inclination angle of the first sidewall 410 of the first light-extraction structure 41 above the blue light-emitting component is set relative to the inclination angle of the third sidewall 430 of the third light-extraction structure 43 above the green light-emitting component, which can balance brightness of blue light and green light, achieving white balance.

In an embodiment of the present disclosure, $75° \geq \beta \geq 65°$, and $75° \geq \gamma \geq 65°$.

In an embodiment of the present disclosure, $\beta > \gamma$. That is, the inclination angle of the second light-extraction structure 42 corresponding to the red light-emitting component 32 is greater than the inclination angle of the third light-extraction structure 43 corresponding to the green light-emitting component 33.

Meanings of the plurality of second sidewalls 420 of the plurality of second light-extraction structures 42 and the plurality of third sidewalls 430 of the plurality of third light-extraction structures 43 can refer to explanation of the plurality of first sidewalls 410 of the plurality of first light-extraction structures 41, which will not be repeated herein.

In an embodiment, any one of the second sidewall 420 and the third sidewall 430 can have a planar structure, or a curved structure similar to the first curved structure or the second curved structure. That is, the second sidewall 420 and the third sidewall 430 can have the same or similar shape to the first sidewall 410, which will not be repeated herein.

In an embodiment of the present disclosure, as shown in FIG. 17, the plurality of second light-extraction structures 42 includes a plurality of second sidewalls 420. A maximum angle formed between the tangent plane of the second sidewall 420 of the second light-extraction structure 42 and the plane of the substrate 01 is a third angle $\beta$, where $\beta \geq \alpha 1$. The plurality of third light-extraction structures 43 includes a plurality of third sidewalls 430. A maximum angle formed between the tangent plane of the third sidewall 430 of the third light-extraction structure 43 and the plane of the substrate 01 is a fourth angle $\gamma$, where $\gamma \geq \alpha 1$.

That is, the inclination angles of the plurality of second sidewalls 420 of the plurality of second light-extraction structures 42 are all the same, and the maximum angles formed between these second sidewalls 420 and the plane of the substrate 01 are all the third angle $\beta$. The inclination angles of the third sidewalls 430 included in the plurality of third light-extraction structures 43 are all the same, and the maximum angles formed between the second sidewalls 430 and the plane where the substrate 01 are all the fourth angle $\gamma$.

In another embodiment of the present disclosure, as shown in FIG. 18, the plurality of second sidewalls 420 of the plurality of second light-extraction structures 42 includes a third sub-sidewall 421 and a fourth sub-sidewall 422. A maximum angle formed between the tangent plane of the third sub-sidewall 421 and the plane of the substrate 01 is the third angle $\beta$, and a maximum angle formed between the tangent plane of the fourth sub-sidewall 422 and the plane of the substrate 01 is a fifth angle $\beta'$. The third angle and the fifth angle satisfy $\beta > \beta' \geq \alpha 1$.

In an embodiment of the present disclosure, as shown in FIG. 18, among at least one of the first light-extraction structures 41 and at least one of the second light-extraction structures 42, any one of the at least one first light-extraction structure 41 includes both a first sub-sidewall 411 and a second sub-sidewall 412, and any one of the at least one second light-extraction structures 42 includes both a third sub-sidewall 421 and a fourth sub-sidewall 422.

In an embodiment of the present disclosure, referring to FIG. 18, the plurality of third sidewalls 430 of the plurality of third light-extraction structures 43 includes a fifth sub-sidewall 431 and a sixth sub-sidewall 432. A maximum angle formed between a tangent plane of the fifth sub-sidewall 431 and the plane of the substrate 01 is a fourth angle $\gamma$, and a maximum angle formed between the tangent plane of the sixth sub-sidewall 432 and the plane of the substrate 01 is a sixth angle $\gamma'$. The fourth angle and the sixth angle satisfy $\gamma > \gamma' \geq \alpha 1$.

In an embodiment of the present disclosure, as shown in FIG. 18, among at least one of the first light-extraction structures 41 and at least one of the third light-extraction structures 43, any one of the at least one first light-extraction structure 41 includes both a first sub-sidewall 411 and a second sub-sidewall 412, and any one of the at least one third light-extraction structure 43 includes both a fifth sub-sidewall 431 and a sixth sub-sidewall 432.

In an embodiment of the present disclosure, as shown in FIG. 18, among at least one of the first light-extraction structures 41, at least one of the second light-extraction structures 42 and at least one of the third light-extraction structures 43, any one of the at least one first light-extraction structure 41 includes both a first sub-sidewall 411 and a second sub-sidewall 412, any one of the at least one second light-extraction structure 42 includes both a third sub-sidewall 421 and a fourth sub-sidewall 422, and any one of the at least one third light-extraction structure 43 includes both a fifth sub-sidewall 431 and a sixth sub-sidewall 432.

In an embodiment of the present disclosure, the number of the second sub-sidewall is C1, the number of the fourth sub-sidewall is C2, and the number of sixth sub-sidewall is C3, where C1>C3≥C2.

In an embodiment of the present disclosure, when one second light-extraction structure 42 includes both the third sub-sidewall 421 and the fourth sub-sidewall 422, the length of the edge of the red light-emitting component 32 corresponding to the third sub-sidewall 421 is smaller than the length of the edge of the red light-emitting component 32 corresponding to the fourth sub-sidewall 422.

In an embodiment of the present disclosure, when one second light-extraction structure 42 includes both the third sub-sidewall 421 and the fourth sub-sidewall 422, the third sub-sidewall 421 and the fourth sub-sidewall 422 are adjacent to each other.

In an embodiment of the present disclosure, when one third light-extraction structure 43 includes both the fifth sub-sidewall 431 and the sixth sub-sidewall 432, the length of the edge of the green light-emitting component 33 corresponding to the fifth sub-sidewall 431 is smaller than the length of the edge of the green light-emitting component 33 corresponding to the sixth sub-sidewall 432.

In an embodiment of the present disclosure, when one third light-extraction structure 43 includes both the fifth sub-sidewall 431 and the sixth sub-sidewall 432, the fifth sub-sidewall 431 and the sixth sub-sidewall 432 are arranged adjacent to each other.

Figure 19:
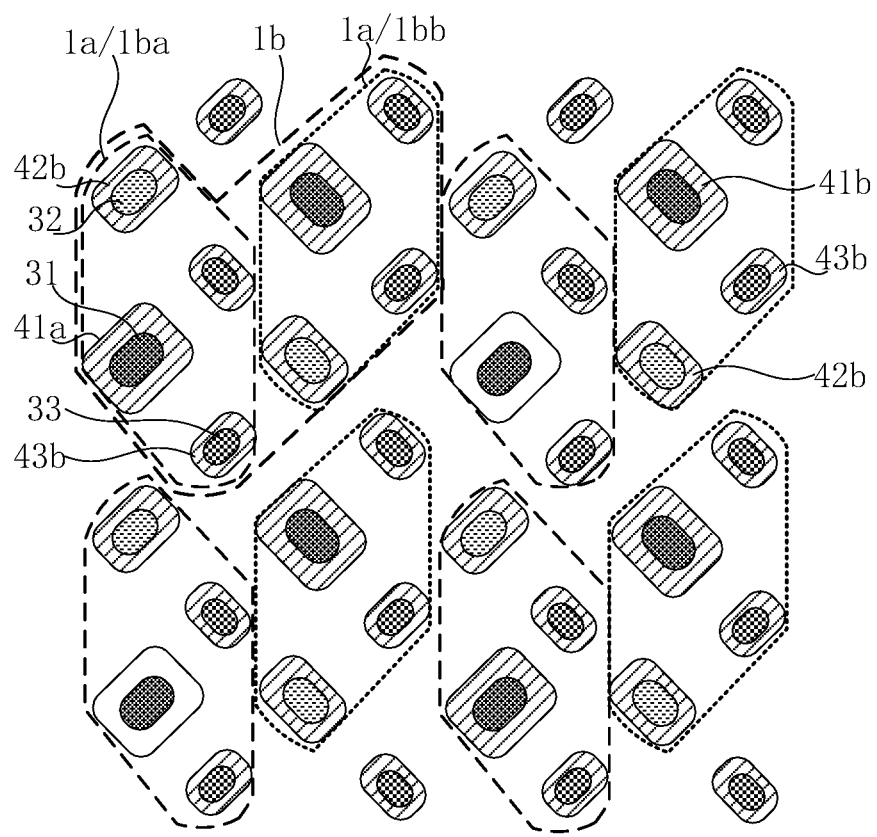
FIG. 19 is a schematic diagram showing a distribution of a light-emitting component and a light-extraction structure of a display panel according to an embodiment of the present disclosure.
Figure 20:
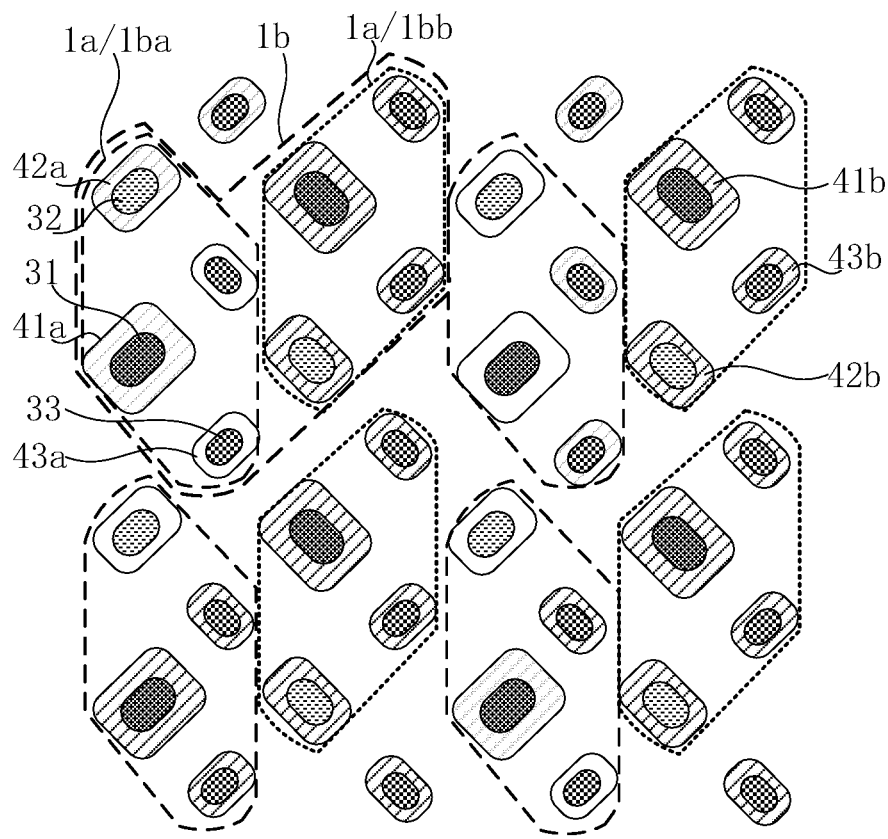
FIG. 20 is a schematic diagram showing a distribution of a light-emitting component and a light-extraction structure of a display panel according to another embodiment of the present disclosure.

FIG. 19 is a schematic diagram showing a distribution of a light-emitting component and a light-extraction structure of a display panel according to an embodiment of the present disclosure, and FIG. 20 is a schematic diagram showing a distribution of a light-emitting component and a light-extraction structure of a display panel according to another embodiment of the present disclosure.

As shown in FIG. 19 and FIG. 20, in an embodiment of the present disclosure, the plurality of light-emitting components 30 in the light-emitting component layer 03 are repeatedly arranged with a first repeating unit 1a. The first repeating unit 1a includes at least one blue light-emitting component 31, at least one red light-emitting component 32, and at least one green light-emitting component 33. The first repeating unit 1a is the smallest repeating unit of arrangement of the light-emitting components 30. For example, as shown in FIG. 16, the first repeating unit 1a includes one blue light-emitting component 31, one red light-emitting component 32 and two green light-emitting components 33.

The plurality of light-extraction structures 40 in the light-extraction layer 04 are repeatedly arranged with a second repeating unit 1b. The second repeating unit 1b covers at least two first repeating units 1a. The second repeating unit 1b is the smallest repeating unit of arrangement of the light-extraction structures 40. For example, as shown in FIG. 19 and FIG. 20, the light-extraction structure 40 in the second repeating unit 1b covers at least part of the light-emitting components 30 included in two first repeating units 1a.

The second repeating unit 1b includes a first light-extraction structure group 1ba and a second light-extraction structure group 1bb. The first light-extraction structure group 1ba includes the first light-extraction sub-structure 41a. The second light-extraction structure group 1bb includes the second light-extraction sub-structure 41b. The first light-extraction sub-structure 41a and the second light-extraction sub-structure 41b overlap with different blue light-emitting components 31, respectively. That is, the first light-extraction structure group 1ba and the second light-extraction structure group 1bb in the same one second repeating unit correspond to two first repeating units 1a covered by the second repeating unit 1b, respectively. The first light-extraction sub-structure 41a in the first light-extraction structure group 1ba overlaps with the blue light-emitting components 31 included by one first repeating units 1a. The second light-extraction sub-structure 41b in the second light-extraction structure group 1bb overlaps with the blue light-emitting component 31 included in the other first repeating unit 1a.

The sidewalls of the first light-extraction sub-structure 41a include a first sub-sidewall 411, and the sidewalls of the second light-extraction sub-structure 41b includes a second sub-sidewall 412. That is, the first light-extraction sub-structures 41a and the second light-extraction sub-structures 41b are evenly distributed, and the first sub-sidewalls 411 and the second sub-sidewalls 412 are evenly distributed.

In one case, the sidewalls of the first light-extraction sub-structure 41a can all be the first sub-sidewalls 411; in another case, the sidewalls of the first light-extraction sub-structure 41a can includes both the first sub-sidewall 411 and the second sub-sidewall 412.

In an embodiment of the present disclosure, as shown in FIG. 20, at least one of the first light-extraction structure group 1ba and the second light-extraction structure group 1bb that are included in the second repeating unit 1b includes a second light-extraction structure 42 and a third light-extraction structure 43. A maximum angle formed between the second sidewall 420 of the second light-extraction structure 42 of the second repeating unit 1b and the plane of the substrate 01 is the third angle β. That is, the inclination angles of the second sidewalls 420 of the second light-extraction structure 42 of the second repeating unit 1b are all the same. The maximum angles formed between the third sidewalls 430 of the third light-extraction structures 43 of the second repeating unit 1b and the plane of the substrate 01 are all the fourth angle γ. That is, the inclination angles of the third sidewalls 430 of the third light-extraction structures 43 of the second repeating unit 1b are all the same.

In another embodiment of the present disclosure, as shown in FIG. 19, the first light-extraction structure group 1ba further includes a first light-extraction sub-structure 41a, a third light-extraction sub-structure 42a and a fifth light-extraction sub-structure 43a. The second light-extraction structure group 1bb includes a second light-extraction sub-structure 41b, a fourth light-extraction sub-structure 42b and a sixth light-extraction sub-structure 43b.

The first light-extraction sub-structure 41a and the second light-extraction sub-structure 41b overlap with different blue light-emitting components, respectively. The third light-extraction sub-structure 42a and the fourth light-extraction sub-structure 42b overlap with different red light-emitting components 32, respectively. The fifth light-extraction sub-structure 43a and the sixth light-extraction sub-structure 43b overlap with different green light-emitting components, respectively.

The sidewalls of the first light-extraction sub-structure 41a include the first sub-sidewall 411. The sidewalls of the second light-extraction sub-structure 41b are the second sub-sidewalls 412. The sidewalls of the third light-extraction sub-structure 42a include the third sub-sidewall 421. The sidewalls of the fourth light-extraction sub-structure 42b are the fourth sub-sidewalls 422. The sidewalls of the fifth light-extraction sub-structure 43a include the fifth sub-sidewall 431. The sidewalls of the sixth light-extraction sub-structure 43b are the sixth sub-sidewall 432.

Figure 21:
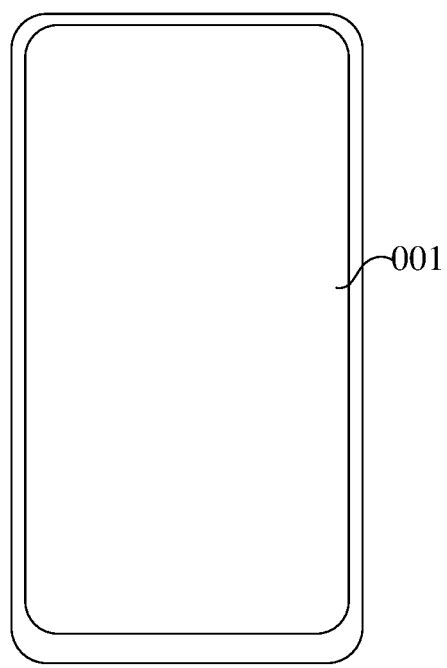
FIG. 21 is a schematic diagram showing a display apparatus according to an embodiment of the present disclosure.

FIG. 21 is a schematic diagram showing a display apparatus according to an embodiment of the present disclosure.

As shown in FIG. 21, the display apparatus provided by the present disclosure includes the display panel 001 provided in the foregoing embodiments. The display apparatus provided by the present disclosure can be a mobile phone, a computer, a television, or the like.

In the present disclosure, the first light-extraction structure 41 is provided above the first-color light-emitting component 31, and the plurality of first sidewalls of the plurality of first light-extraction structures 41 has different inclination angles. The first sub-sidewall 411 with a larger inclination angle increases amount of reflective light reaching the front viewing angle while reducing amount of light reaching the front viewing angle through refraction, thereby correspondingly reducing the color cast caused by refraction. The second sub-sidewall 412 with a smaller inclination angle can achieve the amount of the refracted light reaching the front viewing angle, thereby significantly increasing the amount of light under the front viewing angle and improving the brightness of the display apparatus.

The above are merely some embodiments of the present disclosure, which, as mentioned above, are not intended to limit the present disclosure. Within the principles of the present disclosure, any modification, equivalent substitution, improvement shall fall into the protection scope of the present disclosure.

What is claimed is:
1. A display panel, comprising:
   a substrate;
   a light-emitting component layer provided at a side of the substrate facing towards a light-emitting surface of the display panel and comprising light-emitting components; and
   a light-extraction layer provided at a side of the light-emitting component layer facing towards the light-emitting surface of the display panel and comprising light-extraction structures and a peripheral structure, wherein a film in which the light-extraction structures are located is at a side away from the light-emitting component layer, of a film in which the peripheral structure is located, and the peripheral structure surrounds the light-extraction structures and has a refractive index smaller than a refractive index of each of the light-extraction structures,
   wherein the light-emitting components comprise first-color light-emitting components, and an orthographic projection of one of the first-color light-emitting components on the substrate overlaps with an orthographic projection of one of the light-extraction structures on the substrate;
   wherein the light-extraction structures comprise first light-extraction structures, and an orthographic projection of one of the first light-extraction structures on the substrate overlaps with an orthographic projection of one of the first-color light-emitting components on the substrate; and wherein the first light-extraction structures comprise first sidewalls, wherein the first sidewalls comprise first sub-sidewalls and second sub-sidewalls, wherein a maximum angle formed between a tangent plane of one of the first sub-sidewalls and a plane of the substrate is a first angle α1, and a maximum angle formed between a tangent plane of one of the second sub-sidewalls and the plane of the substrate is a second angle α2, where α1≥α2.

2. The display panel according to claim 1, wherein 75°>α1≥65°, and 55°≥α2≥45°.

3. The display panel according to claim 1, wherein each of the first sidewalls is a first curved structure, and wherein a third angle formed between a tangent plane of the first curved structure and the plane of the substrate firstly increases and then decreases in a direction from one of the first-color light-emitting components to a corresponding one of the first light-extraction structures.

4. The display panel according to claim 1, wherein each of the first sidewalls is a second curved structure, and wherein a fourth angle formed between a tangent plane of the second curved structure and the plane of the substrate gradually decreases in a direction from one of the first-color light-emitting components to a corresponding one of the first light-extraction structures.

5. The display panel according to claim 1, wherein each of the first sidewalls is a planar structure.

6. The display panel according to claim 1, wherein the first light-extraction structures comprise at least one first light-extraction sub-structure and at least one second light-extraction sub-structure, wherein a first light-extraction sub-structure of the at least one first light-extraction sub-structure and a second light-extraction sub-structure of the at least one second light-extraction sub-structure overlap with different first-color light-emitting components of the first-color light-emitting components, respectively; and wherein sidewalls of the at least one first light-extraction sub-structure are the first sub-sidewalls, and sidewalls of the at least one second light-extraction sub-structure are the second sub-sidewalls.

7. The display panel according to claim 1, wherein the first light-extraction structures comprise at least one first light-extraction sub-structure, and the first sidewalls of one of the at least one first light-extraction sub-structure comprises one of the first sub-sidewalls and one of the second sub-sidewalls.

8. The display panel according to claim 7, wherein the first light-extraction structures further comprise at least one second light-extraction sub-structure, and each of the first sidewalls of each of the at least one second light-extraction sub-structure is one of the second sub-sidewalls.

9. The display panel according to claim 7, wherein a length of an edge of one of the first-color light-emitting components corresponding to one of the first sub-sidewalls is smaller than a length of an edge of another one of the first-color light-emitting components corresponding to one of the second sub-sidewalls; or wherein the one of the first sub-sidewalls and the one of the second sub-sidewall are adjacent to each other.

10. The display panel according to claim 6, wherein a number n1 of the at least one first light-extraction sub-structure and a number n2 of the at least one second light-extraction sub-structure satisfy |(n1−n2)/(n1+n2)|≤20%.

11. The display panel according to claim 10, wherein the at least one first light-extraction sub-structure comprises a plurality of first light-extraction sub-structures, the at least one second light-extraction sub-structure comprises a plurality of second light extraction sub-structures, and m second light-extraction sub-structures of the plurality of second light-extraction sub-structures are disposed between two adjacent first light-extraction sub-structures of the plurality of first light-extraction sub-structures, where 1≤m≤5, and m is a positive integer.

12. The display panel according to claim 10, wherein the at least one first light-extraction sub-structure comprises a plurality of first light-extraction sub-structures, the at least one second light-extraction sub-structure comprises a plurality of second light-extraction sub-structures, and a second light-extraction sub-structure of the plurality of second light-extraction sub-structures is disposed between two adjacent first light-extraction sub-structures of the plurality of first light-extraction sub-structures, and one of the plurality of first light-extraction sub-structures is disposed between two adjacent second light-extraction sub-structures of the plurality of second light extraction sub-structures.

13. The display panel according to claim 1, wherein the first-color light-emitting components are blue light-emitting components;

wherein the light-emitting components further comprise red light-emitting components and green light-emitting components; and wherein the light-extraction structures further comprise second light-extraction structures and third light-extraction structures, an orthographic projection of one of the second light-extraction structures on the substrate overlaps with an orthographic projection of one of the red light-emitting components on the substrate, and an orthographic projection of one of the third light-extraction structures on the substrate overlaps with an orthographic projection of one of the green light-emitting components on the substrate.

14. The display panel according to claim 13, wherein the second light-extraction structures comprise second sidewalls, and a maximum angle between a tangent plane of each of the second sidewalls of the second light-extraction structures and the plane of the substrate is a third angle β, where β≥α1; and wherein the third light-extraction structures comprise third sidewalls, and a maximum angle formed between a tangent plane of each of the fourth sidewalls of the third light-extraction structures and the plane of the substrate is a fourth angle γ, where γ≥α1.

15. The display panel according to claim 13, wherein the second light-extraction structures comprise second sidewalls comprising one of the third sub-sidewalls and one of fourth sub-sidewalls, a maximum angle formed between a tangent plane of the one of the third sub-sidewalls and the plane of the substrate is a third angle β, and a maximum angle formed between a tangent plane of the one of the fourth sub-sidewalls and the plane of the substrate is a fifth angle β', where β<β'≤α1; and wherein the third light-extraction structures comprise third sidewalls comprising one of fifth sub-sidewalls and one of sixth sub-sidewalls, a maximum angle formed between a tangent plane of the one of the fifth sub-sidewalls and the plane of the substrate is a fourth angle γ, and a maximum angle formed between a tangent plane of the one of the sixth sub-sidewalls and the plane of the substrate is a sixth angle γ', where γ>γ'≥α1.

16. The display panel according to claim 14, wherein 75°≥β≥65° and 75°≥γ≥65°; or β>γ.

17. The display panel according to claim 15, wherein a number C1 of the second sub-sidewalls, a number C2 of the fourth sub-sidewalls, and a number C3 of the sixth sub-sidewalls satisfy C1>C3≥C2.

18. The display panel according to claim 15, wherein the light-emitting components are repeatedly arranged with first repeating units, and each of the first repeating units comprises at least one blue light-emitting component, at least one red light-emitting component, and at least one green light-emitting component;
    wherein the light-extraction structures are repeatedly arranged with second repeating units, and one of the second repeating units covers at least two of the first repeating units;
    wherein one of the second repeating units comprises a first light-extraction structure group and a second light-extraction structure group, the first light-extraction structure group comprises a first light-extraction sub-structure, and the second light-extraction structure group comprises a second light-extraction sub-structure; and
    wherein the first light-extraction sub-structure and the second light-extraction sub-structure overlap with different blue light-emitting components located in two repeating units of the first repeating units, respectively, sidewalls of the first light-extraction sub-structure comprise one of the first sub-sidewalls, and sidewalls of the second light-extraction sub-structure comprise one of the second sub-sidewalls.

19. The display panel according to claim 15, wherein the light-emitting components are repeatedly arranged with first repeating units, and each of the first repeating units comprises at least one blue light-emitting component, at least one red light-emitting component, and at least one green light-emitting component;
    wherein the light-extraction structures are repeatedly arranged with second repeating units, one of the second repeating units covers at least two of the first repeating units;
    wherein one of the second repeating units comprises a first light-extraction structure group and a second light-extraction structure group; the first light-extraction structure group comprises a first light-extraction sub-structure, a third light-extraction sub-structure, and a fifth light-extraction sub-structure; and the second light-extraction structure group comprises a second light-extraction sub-structure, a fourth light-extraction sub-structure, and a sixth light-extraction sub-structure;
    wherein the first light-extraction sub-structure and the second light-extraction sub-structure overlap with different blue light-emitting components located in two of the first repeating units, respectively; the third light-extraction sub-structure and the fourth light-extraction sub-structure overlap with different red light-emitting components located in two of the first repeating units, respectively; and the fifth light-extraction sub-structure and the sixth light-extraction sub-structure overlap with different blue light-emitting components located in two of the first repeating units, respectively; and
    wherein sidewalls of the first light-extraction sub-structure comprise one of the first sub-sidewalls, and sidewalls of the second light-extraction sub-structure are the second sub-sidewalls; sidewalls of the third light-extraction sub-structure comprises one of the third sub-sidewalls, sidewalls of the fourth light-extraction sub-structure are the fourth sub-sidewalls; sidewalls of the fifth light-extraction sub-structure comprise one of the fifth sub-sidewalls, and sidewalls of the sixth light-extraction sub-structure are the sixth sub-sidewalls.

20. A display apparatus comprising a display panel, wherein the display panel comprises:
    a substrate;
    a light-emitting component layer provided at a side of the substrate facing towards a light-emitting surface of the display panel and comprising light-emitting components; and
    a light-extraction layer disposed at a side of the light-emitting component layer facing towards the light-emitting surface of the display panel and comprising light-extraction structures and a peripheral structure, a film in which the light-extraction structures are located is at a side away from the light-emitting component layer, of a film in which the peripheral structure is located, the peripheral structure surrounding the light-extraction structures and having a refractive index smaller than a refractive index of each of the light-extraction structures,
    wherein the light-emitting components comprise first-color light-emitting components, and an orthographic projection of one of the first-color light-emitting components on the substrate overlaps with an orthographic projection of one of the light-extraction structures on the substrate;
    wherein the light-extraction structures comprise first light-extraction structures, and an orthographic projection of one of the first light-extraction structures on the substrate overlaps with an orthographic projection of one of the first-color light-emitting components on the substrate; and
    wherein the first light-extraction structures comprise first sidewalls, wherein the first sidewalls comprise first sub-sidewalls and second sub-sidewalls, a maximum angle formed between a tangent plane of one of the first sub-sidewalls and a plane of the substrate is a first angle $\alpha 1$, and a maximum angle formed between a tangent plane of one of the second sub-sidewalls and the plane of the substrate is a second angle $\alpha 2$, where $\alpha 1 > \alpha 2$.

21. A display panel, comprising:
    a substrate;
    a light-emitting component layer provided at a side of the substrate facing towards a light-emitting surface of the display panel and comprising light-emitting components; and
    a light-extraction layer provided at a side of the light-emitting component layer facing towards the light-emitting surface of the display panel and comprising light-extraction structures and a peripheral structure, the peripheral structure surrounding the light-extraction structures and having a refractive index smaller than a refractive index of each of the light-extraction structures,
    wherein the light-emitting components comprise first-color light-emitting components, and an orthographic projection of one of the first-color light-emitting components on the substrate overlaps with an orthographic projection of one of the light-extraction structures on the substrate;
    wherein the light-extraction structures comprise first light-extraction structures, and an orthographic projection of one of the first light-extraction structures on the substrate overlaps with an orthographic projection of one of the first-color light-emitting components on the substrate;

wherein the first light-extraction structures comprise first sidewalls, wherein the first sidewalls comprise first sub-sidewalls and second sub-sidewalls, wherein a maximum angle formed between a tangent plane of one of the first sub-sidewalls and a plane of the substrate is a first angle $\alpha 1$, and a maximum angle formed between a tangent plane of one of the second sub-sidewalls and the plane of the substrate is a second angle $\alpha 2$, where $\alpha 1 > \alpha 2$;

wherein the first-color light-emitting components are blue light-emitting components;

wherein the light-emitting components further comprise red light-emitting components and green light-emitting components; and wherein the light-extraction structures further comprise second light-extraction structures and third light-extraction structures, an orthographic projection of one of the second light-extraction structures on the substrate overlaps with an orthographic projection of one of the red light-emitting components on the substrate, and an orthographic projection of one of the third light-extraction structures on the substrate overlaps with an orthographic projection of one of the green light-emitting components on the substrate.

* * * * *